United States Patent
Wong et al.

(10) Patent No.: US 7,609,081 B2
(45) Date of Patent: Oct. 27, 2009

(54) TESTING SYSTEM AND METHOD FOR TESTING AN ELECTRONIC DEVICE

(75) Inventors: Shih-Fang Wong, Taipei Hsien (TW); Jiang-Feng Shan, Shenzhen (CN); Tsung-Jen Chuang, Taipei Hsien (TW); Wen-Wu Wang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/127,825

(22) Filed: May 28, 2008

(65) Prior Publication Data

US 2009/0128173 A1    May 21, 2009

(30) Foreign Application Priority Data

Nov. 16, 2007    (CN) .................. 2007 1 0202574

(51) Int. Cl.
*G01R 31/26* (2006.01)

(52) U.S. Cl. ..................... 324/765; 324/73.1

(58) Field of Classification Search ............. None
See application file for complete search history.

(56) References Cited

U.S. PATENT DOCUMENTS

| 4,392,107 A | * | 7/1983 | Gollomp | 324/73.1 |
| 6,766,485 B1 | * | 7/2004 | Sakaguchi | 714/724 |
| 7,132,844 B2 | | 11/2006 | Hashimoto | |

* cited by examiner

*Primary Examiner*—Minh N Tang
(74) *Attorney, Agent, or Firm*—Frank R. Niranjan

(57) ABSTRACT

A testing system for measuring an electronic device includes a main controller for generating a control signal, a signal generator for outputting a predetermined test input signal according to the control signal, an instrument unit having a plurality of instruments, and a testing port having a plurality of probes. The plurality of probes connects corresponding testing points of the electronic device to the signal generator and the instruments. The predetermined test input signal is transmitted to the electronic device via the testing port. The instrument unit processes a test result signal outputted by the electronic device and outputs a result data. The main controller receives the result data and computes whether the result data is within a predetermined range. A related testing method is also provided.

13 Claims, 3 Drawing Sheets

TESTING SYSTEM AND METHOD FOR TESTING AN ELECTRONIC DEVICE

BACKGROUND

1. Field of the Invention

The present invention relates to a system and a method for testing an electronic device.

2. Description of related art

Electronic devices are always tested before being sold to the public so as to ensure quality assurance of the electronic devices. Various testing/measuring tools are employed for the test, including multimeters, oscillographs, etc. When performing the test on an electronic device using a multimeter or an oscillograph, a tester performing the test has to manually move the electronic device repetitiously according to different test requirements and stages. Thus manually performing the test is tedious and time consuming and manual testing are subjected to human errors resulting in low-accuracy of the test result.

Therefore, an improved testing system and method are needed to address the aforementioned deficiency and inadequacies.

SUMMARY

An exemplary testing system for measuring an electronic device includes a main controller for generating a control signal, a signal generator for outputting a predetermined test input signal according to the control signals, an instrument unit comprising a plurality of instruments, and a testing port comprising a plurality of probes. The probes are configured for connecting corresponding testing points of the electronic device to the signal generator and the instruments. The predetermined test input signal is transmitted to the electronic device via the testing port, the instrument unit processing a test result signals outputted by the electronic device and outputting a result data, and the main controller receiving the result data and computing whether the result data is within a predetermined range. A related testing method is also provided.

Other advantages and novel features of the present invention will become more apparent from the following detailed description of preferred embodiment when taken in conjunction with the accompanying drawings.

DETAILED DESCRIPTION OF THE EMBODIMENTS

Reference will now be made to the drawings to describe a preferred embodiment of the present testing system and method.

Figure 1:
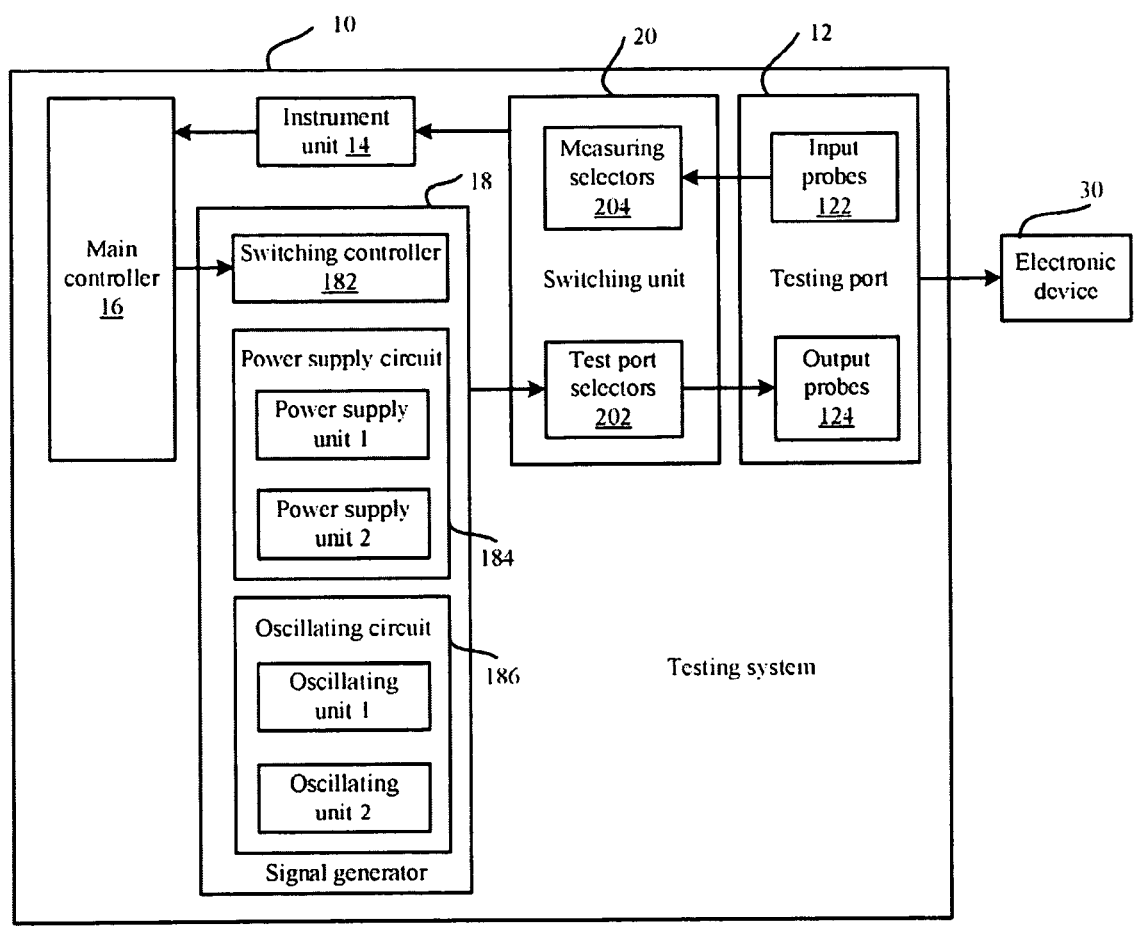
FIG. 1 illustrates a block diagram showing a testing system for testing an electronic device in accordance with a first exemplary embodiment.

Referring to FIG. 1, in a first exemplary embodiment, a testing system 10 for testing an electronic device 30 includes a testing port 12, an instrument unit 14, a main controller 16, a signal generator 18, and a switching unit 20. The electronic device 30 has a plurality of testing points, such as a power input port, a signal input port, a signal output port, and terminals of electronic elements of the electronic device 30.

The testing port 12, is an input/output interface of the testing system 10, and includes a plurality of probes for connecting to the testing points of the electronic device 30. In the preferred embodiment, the probes are double-ended probes, and include input probes 122 and output probes 124.

The instrument unit 14 is configured for processing test result signals received from the input probes, generating and transmitting result data to the main controller 16. The instrument unit 14 includes a plurality of instruments (not shown), such as ammeters, voltmeters, frequency meters, etc.

The main controller 16 is configured for controlling the testing process, such as switching test configurations, measuring, processing, and recording the result of the test. The main controller 16 is connected to the signal generator 18 and the instrument unit 14. In the preferred embodiment, the main controller 16 is a computer. In operation, the main controller 16 generates control signals to control operations of the signal generator 18, receives the result data from the instrument unit 14, and processes the result data. In detail, the main controller 16 receives and formats the result data in a predetermined format, displays the result data on a display (not shown), and outputs a viewable or audible alarm when the result data is not within a predetermined range.

The signal generator 18, connected between the main controller 16 and the switching unit 20, is configured for generating predetermined test input signals and switching signals according to the control signals. The predetermined test input signals includes a plurality of different signals, having different current, voltage, and/or frequency value from each other. Thus, when one of the predetermined test input signals is inputted to the electronic device 30, the instrument unit 14 can receive a corresponding test result signal outputted by the electronic device 30. The switching signals are used for controlling the switching actions of the switching unit 20. In the preferred embodiment, the signal generator 18 includes a programmable logic controller (PLC) and a plurality of periphery circuits. Because the number of pins of the input/output port of the PLC is limited, an expansion unit (not shown, a 8255 programmable peripheral interface for example) may be required.

The signal generator 18 includes a switching controller 182, a power supply circuit 184, and an oscillating circuit 186. The switching controller 182 is configured for generating the switching signals according to the control signals.

The power supply circuit 184 is configured for generating predetermined voltages and currents (these are the predetermined test input signals having predetermined currents and/or voltages) for voltage tests, current tests, and impedance tests. Generally, power supply modes of the electronic device 30 may include an external power mode, a battery power mode, and a USB power mode. When testing the electronic device 30, each test case should be performed under each of the power supply modes. Thus, the power supply circuit 184 should include a plurality of power supply units (power supply unit 1 and 2, for example) for generating different voltages/currents corresponding to the power supply modes.

The oscillating circuit 186 is configured for generating the predetermined test input signals with the predetermined frequencies for frequency tests. When the electronic device 30 includes an aggregation circuit board having two circuit boards connected together in a board to board mode, the frequency test can be used for testing the connectivity between the two circuit boards. In operation, the oscillating circuit 186 generates a first signal with a predetermined frequency. The first signal is then transmitted to one of the two circuit boards. The instrument unit 14 receives a second signal from the other circuit board, and outputs a frequency value. The main controller 16 receives the frequency value, and computes whether the frequency value is within a normal range. If the frequency value is within the normal range, the connectivity is good, otherwise, the connectivity is poor. The oscillating circuit 186 may include a plurality of oscillating units (oscillating unit 1 and 2 for example) for generating test input signals with different frequencies.

The switching unit 20, including a plurality of switches, is configured for switching connections of the testing port 12 and the signal generator 18, and connections of testing port 12 and the instrument unit 14 according to the switching signals. In the preferred embodiment, the switches of the switching unit 14 are relays. The plurality of switches includes test port selectors 202 and measuring selectors 204. The test port selectors 202 are operable to connect the signal generator 18 to corresponding one or more output probes 124 of the testing port 12 to transmit the predetermined test input signals to the electronic device 30. The measuring selectors 204 are operable to connect corresponding one or more input probes 122 of the testing port 12 to corresponding one or more instruments to transmit signals from the electronic device 30 to the one or more instruments.

In operation, the main controller 16 generates a control signal according to a test case (a current test for example). The switching controller 182 generates a switching signal according to the control signal. One or more test port selectors 202 of the switching unit 20 is operated to connect one of the plurality of power supply units of the power supply circuit 184, or one of the plurality of oscillating units of oscillating circuit 186 to corresponding testing point(s) of the electronic device 30 via corresponding output probe(s) 124 of the testing port 12. Thus, a corresponding test input signal is outputted to the electronic device 30. Meanwhile, one or some measuring selectors 204 of the switching unit 20 is operated to connect corresponding instrument(s) of the instrument unit 14 to corresponding testing point(s) of the electronic device 30 via corresponding input probe(s) 122 of the testing port 12. Thus, corresponding result data is generated and transmitted to the main controller 16 by the corresponding instrument(s). The main controller 16 receives and stores the result data, and computes whether the result data is within the predetermined range. If not, the main controller 16 outputs the visual or audible alarm. Then the main controller 16 generates another control signal according to the next test case to start the next test case (a volt test for example).

Figure 2:
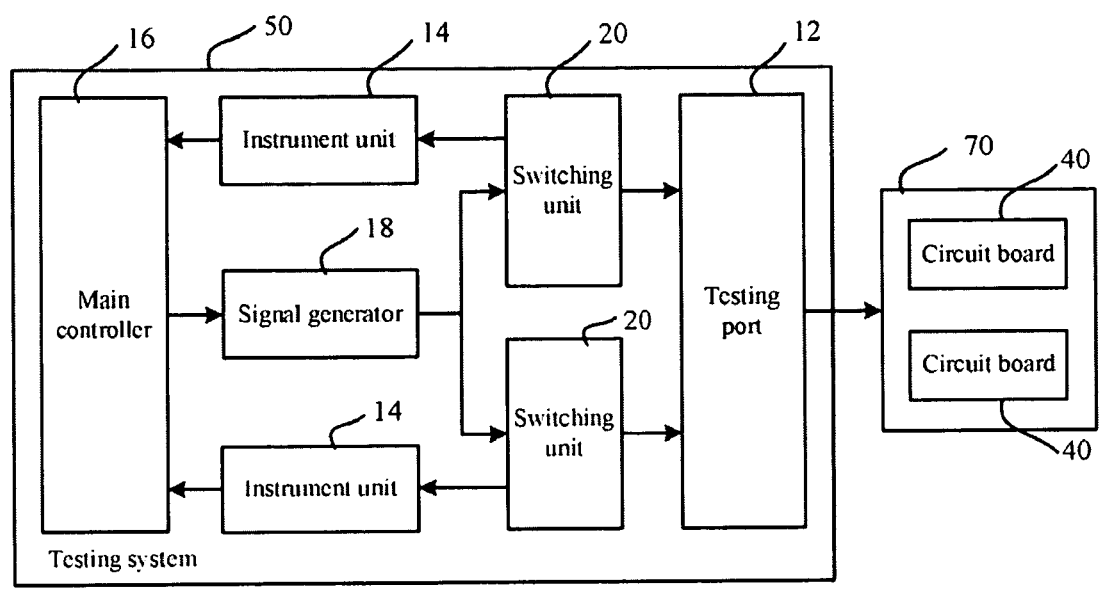
FIG. 2 illustrates a block diagram showing a testing system for testing two same electronic devices in accordance with a second exemplary embodiment.

Referring to FIG. 2, in a second exemplary embodiment, a testing system 50 for testing an electronic device 70 includes a testing port 12, two instrument units 14, a main controller 16, a signal generator 18, and two switching units 20. The electronic device 70 includes the two same circuit boards 40. The two instrument units 14 and switching units 20 are used for testing the two circuit boards 40 synchronously. In other embodiments, the testing system 50 can include additional instrument units 14 and switching units 20 for testing additional circuit boards 40 synchronously.

In other embodiments, when the instrument unit 14 includes too much instruments whereby there is not enough input interfaces in the main controller 16, corresponding switches are necessary for switching the connections between the instruments and the input interfaces of the main controller 16.

As described above, the testing systems 10 and 50 can automatically test the electronic device 30 without swapping out the test instruments or moving the electronic device 30 to different work benches. Thus, a testing time is shortened, and an accurate test result can be assured.

Figure 3:
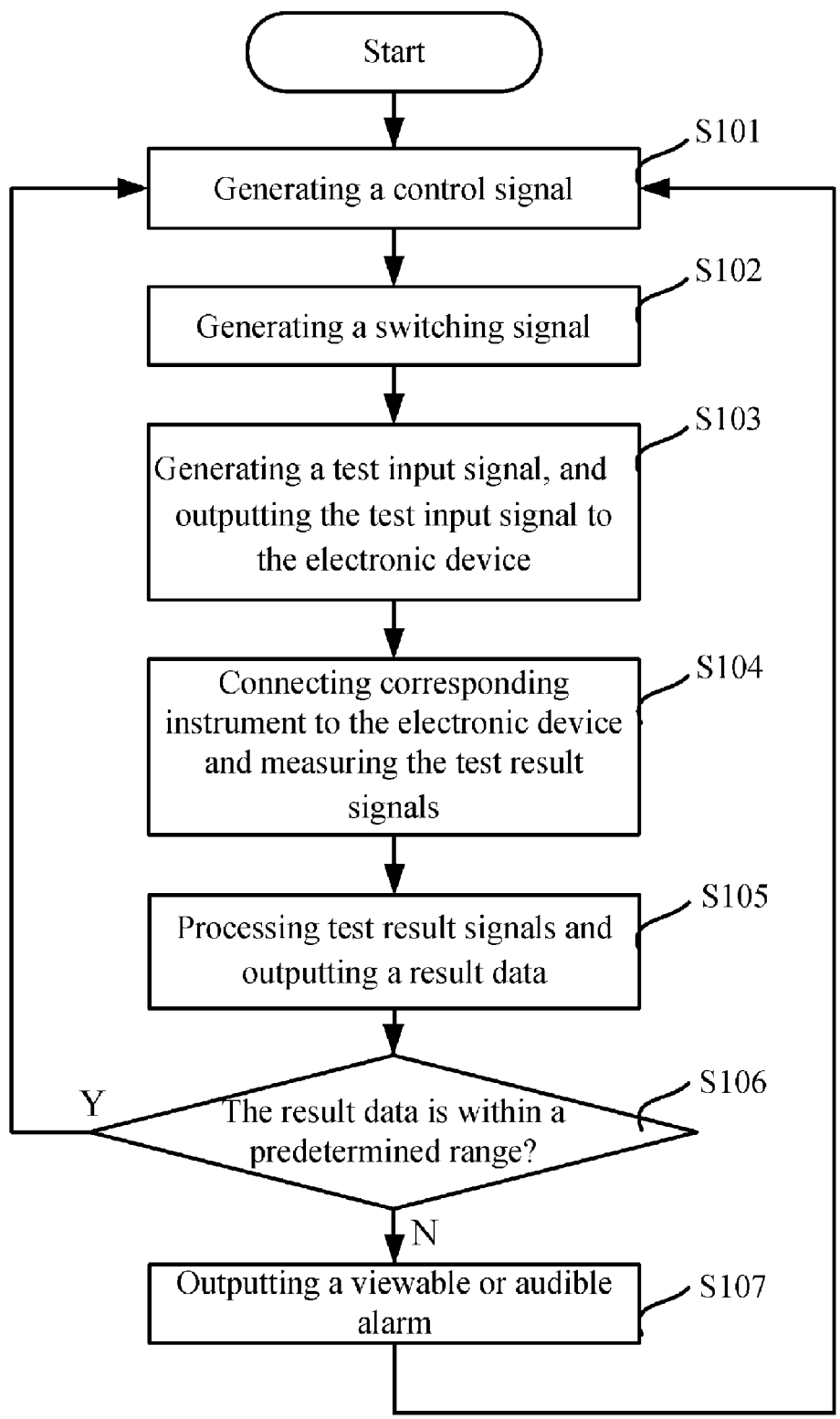
FIG. 3 illustrates a block diagram showing a testing method in accordance with an exemplary embodiment.

Referring to FIG. 3, in an exemplary embodiment, a testing method for testing an electronic device includes the following steps.

In step S101, generating a control signal is performed. For example, the main controller 16 of the testing system 10 in FIG. 1 generates a control signal according to a test case.

In step S102, generating a switching signal according to the control signal is performed. For example, the switching controller 182 in FIG. 1 generates a switching signal according to the control signal.

In step S103, generating a test input signal according to the control signal, and outputting the test input signal to the electronic device are performed. For example, the signal generator 18 in FIG. 1 generates a predetermined test input signal according to the control signal, while one or more test port selectors 202 of the switching unit 20 is operated to connect one of output of the signal generator 18 to corresponding testing point(s) of the electronic device 30 via corresponding output probe(s) 124 of the testing port 12. Thus, the test input signal is outputted to the electronic device 30.

In step S104, selecting an instrument and connecting the instrument to a corresponding testing point of the electronic device, and enabling the instrument to measure the test result signals are performed. For example, one or some measuring selectors 204 of the switching unit 20 in FIG. 1 is operated to connect corresponding instrument of the instrument unit 14 to corresponding testing point(s) of the electronic device 30 via corresponding input probe(s) 122 of the testing port 12. Thus, corresponding result data is generated and transmitted to the main controller 16 by the corresponding instrument.

In step S105, processing test result signals corresponding to the test input signal and outputting a result data are performed. For example, the main controller 16 in FIG. 1 receives, stores, and formats the result data in a predetermined format. The main controller 16 may also display the result data on a display.

In step S106, computing whether the result data is within a predetermined range. If the result data is within the predetermined range, the testing procedure proceeds to step S101. If the result data is not within the predetermined range, the testing procedure proceeds to step S107. For example, the main controller 16 in FIG. 1 computes whether the result data is within a predetermined range.

In step S107, outputting a viewable or audible alarm is performed. Then, the testing procedure proceeds to step S107 to perform the next text case. For example, the main controller 16 outputs a viewable or audible alarm, and then generates another control signal according to the next test case to start the next test case.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A testing system for measuring an electronic device, comprising:

a main controller for generating a control signal;

a signal generator for outputting a predetermined test input signal according to the control signal;

an instrument unit comprising a plurality of instruments; and a testing port comprising a plurality of probes for connecting corresponding testing points of the electronic device to the signal generator and the instruments;

wherein the predetermined test input signal is transmitted to the electronic device via the testing port, the instrument unit processes test result signals outputted by the electronic device and outputs a result data, and the main controller receives the result data and computes whether the result data is within a predetermined range;

wherein the electronic device further comprises a switching unit comprising a plurality of switches for switching connections of the plurality of probes and the signal generator according to the control signal, the signal generator comprises a switching controller for generating a switching signal to control the switching actions of the plurality of switches according to the control signal.

2. The testing system as described in claim 1, wherein the predetermined test input signal comprises at least one of a predetermined current, voltage, and frequency.

3. The testing system as described in claim 1, wherein the plurality of switches is further configured for switching connections of corresponding probes and the instruments according to the control signal; at least one of the instruments measures the test result signals outputted by the electronic device via corresponding probes.

4. The testing system as described in claim 1, wherein the plurality of switches is controlled by relays.

5. The testing system as described in claim 1, wherein the signal generator further comprises a power supply circuit for generating the predetermined test input signal with at least one of a predetermined current and voltage.

6. The testing system as described in claim 5, wherein the signal generator further comprises an oscillating circuit for generating the predetermined test input signal with a predetermined frequency.

7. A testing method capable of being implemented by a testing system for measuring an electronic device, the testing method comprising:

generating a control signal by a main controller of the testing system;

generating a test input signal by a signal generator of the testing system according to the control signal;

generating a switching signal by the signal generator of the testing system to control switching actions of switches of the testing system according to the control signal;

outputting the test input signal through a test port of the testing system to the electronic device;

processing test result signals corresponding to the test input signal from the electronic device and outputting a result data by an instrument unit of the testing system; and computing the result data to determine whether the result data is within a predetermined range by the main controller.

8. The testing method as described in claim 7, further comprising:

selecting an instrument of the instrument unit and connecting the instrument to a corresponding testing point of the electronic device by a switching unit of the testing system; enabling the instrument to measure the test result signals.

9. The testing method as described in claim 7, further comprising:

enabling a switch of the switching unit to transmit the test input signal to a corresponding testing point of the electronic device.

10. The testing method as described in claim 7, wherein the test input signal comprises at least one of a predetermined current, voltage, and frequency.

11. A testing system for testing an electronic device, the electronic device capable of being operated in an external power mode and a battery power mode, the testing system comprising:

a main controller configured to generate a control signal in response to a test request;

a signal generator operatively coupled to the main controller, the signal generator configured to generate a first set of test signals corresponding to the external power mode of the electronic device and a second set of test signals corresponding to the battery power mode of the electronic device according to the control signal received from the main controller; and a testing port coupled between the signal generator and the electronic device for selectively transmitting the first set of test signals to the electronic device to test the electronic device under the external power mode and the second set of test signals to the electronic device to test the electronic device under the battery power mode.

12. The testing system as described in claim 11, wherein the signal generator comprises a first power supply unit and a second power supply unit, the first power supply unit is configured to generate the first set of test signals according to the control signal received from the main controller, the second power supply unit is configured to generate the second set of test signals according to the control signal received from the main controller.

13. The testing system as described in claim 11, further comprising a switching unit, the signal generator comprising a switching controller coupled between the switching unit and the main controller, the switching controller configured to generate a switching signal according to the control signal to control switching actions of the switching unit.

* * * * *